United States Patent
Mar et al.

(10) Patent No.: US 7,035,324 B2
(45) Date of Patent: Apr. 25, 2006

(54) PHASE-NOISE MEASUREMENT WITH COMPENSATION FOR PHASE NOISE CONTRIBUTED BY SPECTRUM ANALYZER

(75) Inventors: Wing Jong Mar, Rohnert Park, CA (US); Joseph Michael Gorin, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 832 days.

(21) Appl. No.: 09/922,065

(22) Filed: Aug. 1, 2001

(65) Prior Publication Data

US 2003/0031241 A1 Feb. 13, 2003

(51) Int. Cl.
*H04Q 1/20* (2006.01)

(52) U.S. Cl. .................. 375/224; 375/226; 375/227; 324/613; 324/614; 324/622; 324/76.19; 324/76.22

(58) Field of Classification Search ............... 375/224, 375/226, 227; 324/613, 622, 76.19, 76.52, 324/76.27, 76.23, 76.39, 76.22, 614; 702/111; 455/115.2; 331/96

See application file for complete search history.

(56) References Cited

U.S. PATENT DOCUMENTS

| | | | | |
|---|---|---|---|---|
| 5,337,014 A | * | 8/1994 | Najle et al. | 324/613 |
| 6,114,858 A | * | 9/2000 | Kasten | 324/616 |
| 6,246,717 B1 | * | 6/2001 | Chen et al. | 375/226 |
| 6,313,619 B1 | * | 11/2001 | Roth | 324/76.19 |
| 6,393,372 B1 | * | 5/2002 | Rzyski | 702/111 |

OTHER PUBLICATIONS

Application Note 1EPAN 16E, Phase Noise measurements with Spectrum Analyzers of the FSE family, Oct. 2, 1995, Josef Wolf.*

Phase Noise Measurements with Spectrum Analyzers of the FSE family, Application Note 1EPAN 16E, Oct. 2, 1995, Josef Wolf.*

Mouthrup, Andrew A. and Muha, Michael S., Accurate Measurement of Signals Close to the Noise Floor of a Spectrum Analyzer, IEEE Transactions on Microwave Theory and Techniques, vol. 39, No. 11, Nov. 1991, p. 1882-1885.

Rhode & Schwarz Data Sheet for "Phase Noise Measurement Software FS-K4" for use with Spectrum Analyzer Models FSE/FSIQ/FSP/FSU.

Rhode & Schwarz help menus for using phase noise measurement software, Figs. 1-3, including "Making a Phase Noise Measurement".

* cited by examiner

*Primary Examiner*—Stephen Chin
*Assistant Examiner*—Ted M. Wang (57) ABSTRACT

A method and apparatus compensates for phase noise added by a spectrum analyzer from phase noise measurements of a signal under test (SUT) taken by the spectrum analyzer. The method comprises the steps of measuring the phase noise of the SUT, determining the added phase noise of the spectrum analyzer, and applying a mathematical correction to the measured phase noise. A spectrum analyzer apparatus that compensates for added phase noise comprises a controller portion, a memory portion, a signal conversion and detection portion, and a compensation algorithm stored in the memory portion. A system that compensates for added phase noise comprises a controller having a control algorithm and a spectrum analyzer. The compensation and control algorithms are computer programs that implement the method of the present invention.

30 Claims, 3 Drawing Sheets

PHASE-NOISE MEASUREMENT WITH COMPENSATION FOR PHASE NOISE CONTRIBUTED BY SPECTRUM ANALYZER

TECHNICAL FIELD

The present invention relates to test equipment and measurements using test equipment. More particularly, the invention relates to measurement of phase noise of a signal under test.

BACKGROUND ART

Phase noise is noise that manifests itself as unwanted, usually random, fluctuations in a relative phase of a signal. Many modern systems, such as communications systems that employ one or more forms of phase modulation, phased array radars and the global positioning satellite system (GPS), depend on precise, accurate knowledge of signal phase for their operation. Phase noise directly interferes with the operation of these and related systems. Therefore, the measurement of phase noise is an important topic in the field of test and measurement. In particular, an important objective of phase noise measurement is to obtain an accurate measurement of a true phase noise for a given signal under test (SUT).

There are a number of approaches known in the art for measuring phase noise, each method having its own advantages and disadvantages. For example, phase noise can be measured using a frequency discriminator or using a delay line and mixer as a frequency comparator. Another approach uses two sources and a phase comparator. Yet another approach measures phase noise using a heterodyne frequency measurement technique. However, among all of the approaches to phase noise measurement, perhaps the most popular and practical approach uses a spectrum analyzer.

A spectrum analyzer is a device or system that measures the power spectral density (PSD) of a signal or one of several closely related signal parameters. For the purposes of discussion herein, the PSD of a signal can be thought of as a measurement of signal power in a selected bandwidth as a function of frequency. Typically, the spectrum analyzer displays measured PSD in the form of a graph. Phase noise measurements can be extracted or computed from measured PSD of the SUT.

Most spectrum analyzers, especially those used for high frequency RF and microwave signals, are implemented as heterodyne receivers that frequency shift or frequency convert the signal prior to detecting and measuring the power of the signal. A typical spectrum analyzer may employ three or four stages of frequency conversion prior to a signal power measurement. One or more of these frequency conversion stages generally utilizes a swept or stepped frequency local oscillator (LO) to provide frequency scanning or tuning.

Unfortunately, phase noise measurements obtained using spectrum analyzers inevitably contain errors that distort and in some cases, even obscure the true phase noise of the signal under test. In practice, the LOs used in the various frequency conversions along with aspects of detecting and measuring signal power in the spectrum analyzer introduce or add phase noise to the SUT being measured. The added phase noise is typically independent of the signal being measured and is solely due to the operations performed by the spectrum analyzer on the SUT. For example, a major source of added phase noise in the spectrum analyzer is phase noise of a first LO used in a first frequency conversion stage of the spectrum analyzer. The end result is that the magnitude of the phase noise, as measured by the spectrum analyzer, is generally greater than the true or actual phase noise of the SUT due to this added phase noise.

A conventional approach to mitigating the added phase noise effects of the spectrum analyzer used to measure phase noise of the SUT normally involves simply using a better spectrum analyzer. In simple terms, a better spectrum analyzer is one that has lower added phase noise. The lower the added phase noise, the less that added phase noise corrupts the measurements of phase noise of the SUT.

Lower added phase noise in a spectrum analyzer is typically achieved by using cleaner, more stable LOs. This is especially true for the LO used in the first frequency conversion stage or stages. In addition, added phase noise of a spectrum analyzer can often be reduced by increasing the resolution of the signal detection circuitry of the spectrum analyzer. Thus, a better spectrum analyzer, having lower added phase noise, is the result of using better, higher quality components to construct the spectrum analyzer.

However, improving the added phase noise performance in a spectrum analyzer (i.e. reducing added phase noise) typically comes at a price. Even moderate improvements in phase noise performance from one model of spectrum analyzer to another can often result in significant increases in unit price. The increased unit price is due in large part to increased costs of better, higher performance LOs and/or higher resolution detection circuitry necessary to implement spectrum analyzers with lower added phase noise. Much the same thing can be said for the other phase noise measurement approaches known in the art. Increased phase noise measurement accuracy using better measurement devices can become very, sometimes even prohibitively, expensive.

Accordingly, it would be nice to have a more economical approach to obtaining accurate phase noise measurements than simply using a better, more expensive spectrum analyzer. Moreover, it would be advantageous if such an approach could improve accuracy of phase noise measurements produced by virtually any spectrum analyzer, even ones with lower added phase noise. Such an approach would solve a long-standing need in the area of economical phase noise measurement using spectrum analyzers.

SUMMARY OF THE INVENTION

The present invention is a method and apparatus that compensate for phase noise added to actual phase noise of a signal under test (SUT) by a spectrum analyzer. Through compensation, the method and apparatus of the present invention mitigate the effects of the added phase noise, thereby yielding a more accurate determination of the true phase noise of the SUT. Furthermore, a system employing the method of the present invention is applicable to measurements of phase noise performed with virtually any spectrum analyzer.

In one aspect of the present invention, a method of compensating for added phase noise contributed by a spectrum analyzer is provided. The method of compensating comprises the step of applying a mathematical correction to measured phase noise data using information regarding the added phase noise of the spectrum analyzer. The step of applying produces actual phase noise data that more accurately approximates a true phase noise of the SUT than the measured phase noise data. The method of compensating for added phase noise may further comprise the step of measuring the phase noise of the SUT to produce the measured phase noise data and the step of determining the added phase noise of the spectrum analyzer. The method mitigates the effects of the added phase noise associated with the spectrum analyzer and yields a more accurate measure of the true phase noise of the SUT.

In another aspect of the invention, a spectrum analyzer apparatus having added phase noise compensation is provided. The spectrum analyzer apparatus comprises a controller portion, a memory portion, a signal conversion and detection portion, and a compensation algorithm in the form of a computer program stored in the memory portion. The controller portion executes the compensation algorithm during a phase noise measurement by the spectrum analyzer. The compensation algorithm implements the method of compensating according to the present invention. In addition to storing the computer program, the memory portion provides temporary storage for data, such as that produced by the measurement portion.

In yet another aspect of the invention, a system that compensates for added phase noise contributed by a spectrum analyzer to phase noise measurements of an SUT taken by the spectrum analyzer is provided. The compensation system comprises a controller and a spectrum analyzer. The controller comprises a memory, a central processing unit (CPU), a control algorithm stored in the memory, and an input/output control interface. The controller executes the control algorithm and in one embodiment, controls the spectrum analyzer using the control interface during a phase noise measurement of the SUT. The control algorithm, in the form of a computer program, implements the method of compensating of the present invention. In part, the control algorithm computes actual phase noise data from measured phase noise data using added phase noise data for the spectrum analyzer. In another embodiment, the system does not control the spectrum analyzer but instead, the system simply receives measured phase noise data from the spectrum analyzer and compensates for the added phase noise.

The method and apparatus of the present invention facilitate a more economical approach to obtaining accurate phase noise measurements than the conventional approach of using a better spectrum analyzer. Improved accuracy is achieved by the present invention using compensation in the form of a mathematical correction of data obtained with the spectrum analyzer without relying on the use of costly, high performance components in the spectrum analyzer manufacture. Moreover, the method, apparatus and system of the present invention can improve the accuracy of phase noise measurements obtained using any spectrum analyzer. Thus, even measurements obtained with high performance spectrum analyzers can be improved according to the present invention. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a method and apparatus that compensate for added phase noise in phase noise measurements obtained using a spectrum analyzer. The method and apparatus of the present invention attempt to correct for, or at least mitigate, the effects of the added phase noise produced by the spectrum analyzer in the measurements of phase noise of a signal under test (SUT) with the use of a mathematically based compensation. The result of using the added phase noise compensation method and apparatus of the present invention can be a more accurate determination of an actual or true phase noise of the SUT. Moreover, a system employing the method of the present invention can improve the accuracy of phase noise measurements performed using virtually any spectrum analyzer.

In general, phase noise can be viewed as a measure of the short-term stability of a signal S(t). The phase noise is a measure of noise power as a function of frequency offset from a carrier frequency $f_c$, of the signal S(t). Although there are several commonly used definitions for signal characteristics associated with phase noise, for the purposes of simplicity of discussion herein, only phase noise defined as single sided phase noise $L(f_m)$ will be described with respect to the invention.

Single sided phase noise $L(f_m)$ is the ratio of the single sideband power of phase noise in a 1-Hz bandwidth at an offset frequency $f_m$ measured from a carrier frequency $f_c$ to the total power of the signal. Single sideband phase noise $L(f_m)$ is normally given in terms of dBc/Hz where 'dBc' refers to Decibels relative to the carrier. In general, the discussion herein below applies equally to other commonly used signal characteristic definitions associated with phase noise, as one skilled in the art will readily recognize, and all signal characteristic definitions are within the scope of the present invention. Thus, the discussion hereinbelow, while describing the invention with respect to single sideband phase noise $L(f_m)$ for simplicity purposes only, does not limit the scope of the present invention in any way.

Figure 1:
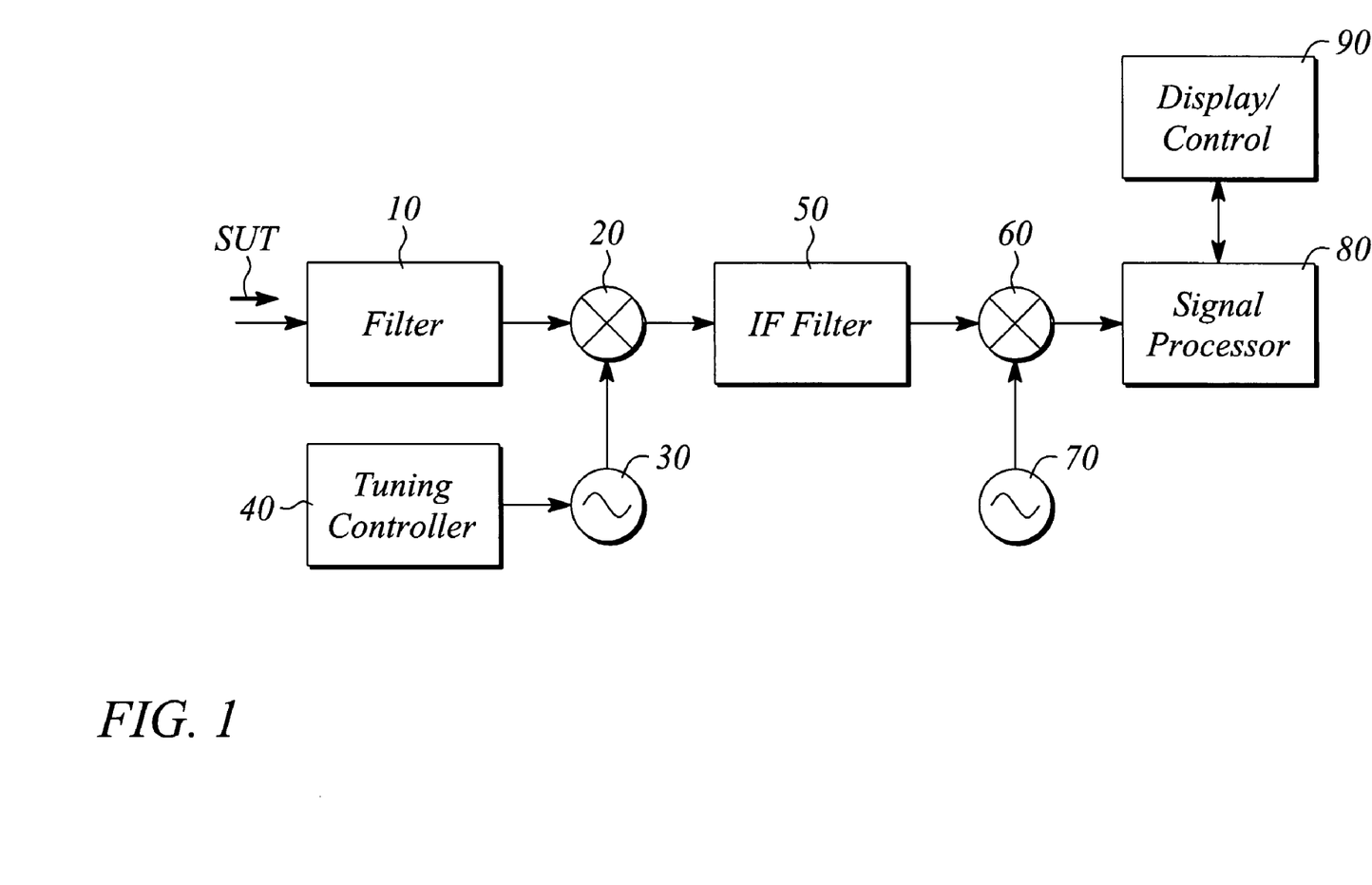
FIG. 1 illustrates a block diagram of a typical spectrum analyzer.

As mentioned hereinabove, one method of measuring phase noise of a SUT uses a spectrum analyzer. FIG. 1 illustrates a conceptual block diagram of a typical spectrum analyzer based on a dual-conversion, heterodyne receiver architecture. The block diagram illustrated in FIG. 1 is included for descriptive purposes only and is not intended to limit the scope of the present invention in any way.

The spectrum analyzer illustrated in FIG. 1 comprises a filter 10, a first mixer 20, a first local oscillator (LO) 30, a tuning controller 40, a first intermediate frequency (IF) filter 50, a second mixer 60, a second LO 70, a signal processor 80 and a display 90. A signal S(t) applied to an input of the spectrum analyzer is filtered by the filter 10 and then mixed with an LO signal from the first LO 30 in the first mixer 20. Mixing the applied signal S(t) with the LO signal frequency converts the applied signal S(t) to a first IF frequency where the converted or IF signal $S_{IF}(t)$ is filtered by the IF filter 50. The IF signal $S_{IF}(t)$ is further frequency converted by mixing the IF signal $S_{IF}(t)$ with a second LO signal from the second LO 70 in the second mixer 60. After the second frequency conversion, the signal is detected and processed by the signal processor 80. Together, these elements 10, 20, 30, 40, 50, 60, 70, 80, comprise a signal conversion and detection portion of a spectrum analyzer. Other architectures for the signal conversion and detection portion are known in the art. In particular, many modern spectrum analyzers have signal and detection portions that employ more than two frequency conversions. All such spectrum analyzers are considered to be within the scope of the present invention.

In addition to the signal conversion and detection portion, most spectrum analyzers further comprise a control portion 90 including a display. The control portion 90 controls the operation of the spectrum analyzer. Measured results obtained by the spectrum analyzer are displayed as data on the display in a graphical format. The display often serves as part of a user interface allowing a user to interact with the control portion 90 in addition to providing data display.

Tuning, or more commonly referred to as 'frequency scanning' when discussing spectrum analyzers, is accomplished by the tuning controller 40. The tuning controller 40 adjusts a frequency of the LO signal of the first LO 30. For example, the tuning controller 40 may comprise a ramp generator that produces a ramped voltage. The first LO 30 may be a voltage controlled oscillator (VCO) that is tuned by the ramped voltage. More commonly, the voltage controller 40 and first LO 30 are combined together and implemented as a tunable frequency synthesizer. A more detailed discussion of the operational and architectural details of spectrum analyzers is beyond the scope of the present discussion. However, one of ordinary skill in the art is familiar with spectrum analyzers and their operation.

To perform a phase noise measurement using a spectrum analyzer, the SUT having a carrier frequency $f_c$ is applied to the input of the spectrum analyzer. The spectrum analyzer sweeps a frequency range containing the SUT carrier frequency $f_c$ and measures signal power detected in a given, selectable bandwidth at a number of frequencies within the frequency range. The measured signal power is recorded by the spectrum analyzer as a set of measured values data. The frequency sweep can be either a continuous sweep or a stepped sweep consisting of discrete frequency points within the frequency range. In either case, a power spectrum of the SUT is produced from the measured signal power data. Often the power spectrum is plotted as magnitude versus frequency on the display 90 of the spectrum analyzer.

Figure 2:
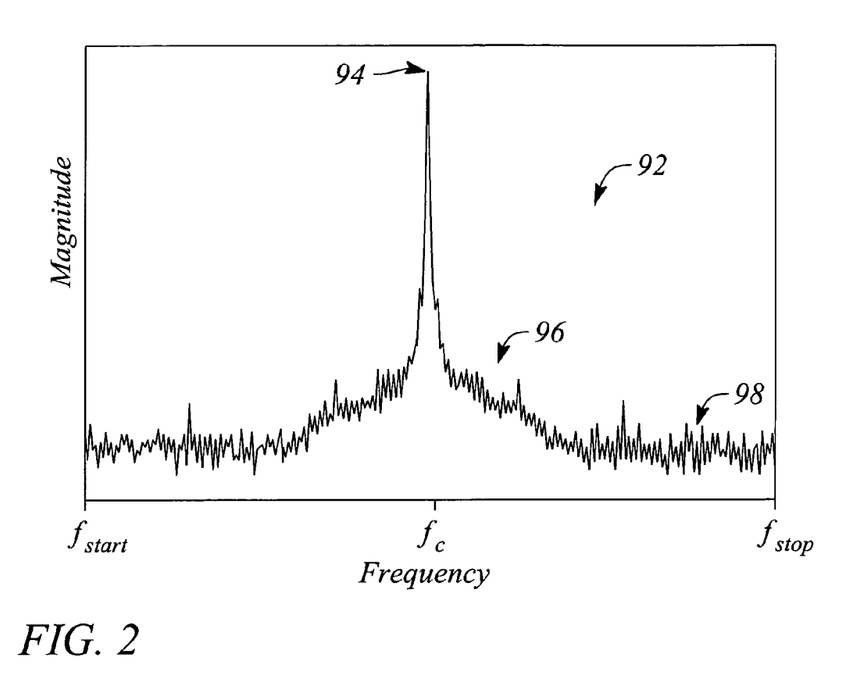
FIG. 2 illustrates an example of a typical power spectrum of a signal under test.

An example of a typical power spectrum 92 of an SUT that might be produced by a spectrum analyzer is illustrated in FIG. 2. As illustrated in FIG. 2, the frequency range is from a frequency $f_{start}$ to a frequency $f_{stop}$. A carrier of the SUT 94 is represented by a high-magnitude, narrow bandwidth portion of the spectrum 92 at a carrier frequency $f_c$. Phase noise associated with the SUT 94 accounts for an increase in a noise level 96 in the vicinity of the carrier frequency $f_c$ of the SUT 94 relative to a spectrum analyzer noise floor or limit 98 at frequencies away from the carrier frequency $f_c$.

The measured phase noise $L(f_m)$ of the SUT is computed from the power spectrum by taking a ratio of the power measured at a set of offset frequencies $f_m$ to power measured at the carrier frequency $f_c$. Of course, the measured phase noise at the intermediate frequency (IF) stage of the spectrum analyzer includes added phase noise $L_{SA}(f_m)$ contributed by the spectrum analyzer as well as the actual phase noise $L_A(f_m)$ of the SUT. As mentioned hereinabove, a principal source of added phase noise in most spectrum analyzers is the first LO signal. A more detailed discussion of measuring phase noise using spectrum analyzers is readily available in a variety of textbooks and other sources including application and product notes from spectrum analyzer manufacturers. For example, one such product note is Agilent Technologies Product Note PN 89400-2, *Measuring Phase Noise with the Agilent 89400 Series Vector Signal Analyzer*, incorporated by reference herein.

As with other types of noise in a system, 'superposition of powers' applies to phase noise $L(f_m)$ in spectrum analyzers. In brief, 'superposition of powers' states that for any system in which the noise can be resolved into a sum of two noise processes $n_1(t)$, $n_2(t)$, the noise power of the sum of the noise processes $n_1(t)+n_2(t)$ is given by equation (1)

$$P_{sum} = P_1 + P_2 + 2E[n_1(t)n_2(t)] \quad (1)$$

where $P_1$ is the power of the noise process $n_1(t)$, $P_2$ is the power of the noise process $n_2(t)$, and $E[n_1(t)n_2(t)]$ is the cross correlation of the noise processes $n_1(t)$, $n_2(t)$. For uncorrelated noise processes $n_1(t)$, $n_2(t)$, the cross correlation $E[n_1(t)n_2(t)]$ is exactly zero and the noise power is simply the sum of the noise powers $P_1$ and $P_2$ of the two uncorrelated noise processes $n_1(t)$, $n_2(t)$.

Advantageously, the added phase noise $L_{SA}(f_m)$ contributed or added by a spectrum analyzer to actual phase noise $L_A(f_m)$ of the SUT resulting in the measured phase noise $L(f_m)$ is primarily related to the phase noise of the LO signals produced by the local oscillators 30, 70. In addition, although to a lesser extent, detection and signal processing operations performed in the signal processor 80 internal to the spectrum analyzer can add phase noise to the measured phase noise $L(f_m)$ of the SUT. As such, the added phase noise of a spectrum analyzer is independent from and therefore, uncorrelated with the actual phase noise $L_A(f_m)$ of the SUT. Since the added phase noise $L_{SA}(f_m)$ of the spectrum analyzer is uncorrelated with the actual phase noise $L_A(f_m)$ of the SUT, the added phase noise $L_{SA}(f_m)$ adds to the actual phase noise $L_A(f_m)$ of the SUT by virtue of superposition of powers. Thus, the measured phase noise $L(f_m)$ for the SUT produced by the spectrum analyzer is the sum of the actual phase noise $L_A(f_m)$ of the SUT and the added phase noise $L_{SA}(f_m)$ of the spectrum analyzer and is given by equation (2)

$$\mathcal{L}(f_m) = 10\log\left[10^{\frac{L_{SA}(f_m)}{10}} + 10^{\frac{L_A(f_m)}{10}}\right] \quad (2)$$

where the phase noises $L(f_m)$, $L_{SA}(f_m)$, and $L_A(f_m)$ are all given in terms of dBc/Hz. In addition to being additive, the added phase noise $L_{SA}(f_m)$ of the spectrum analyzer typically is characterized by an essentially stationary random process, varying only slowly with time and temperature.

Figure 3:
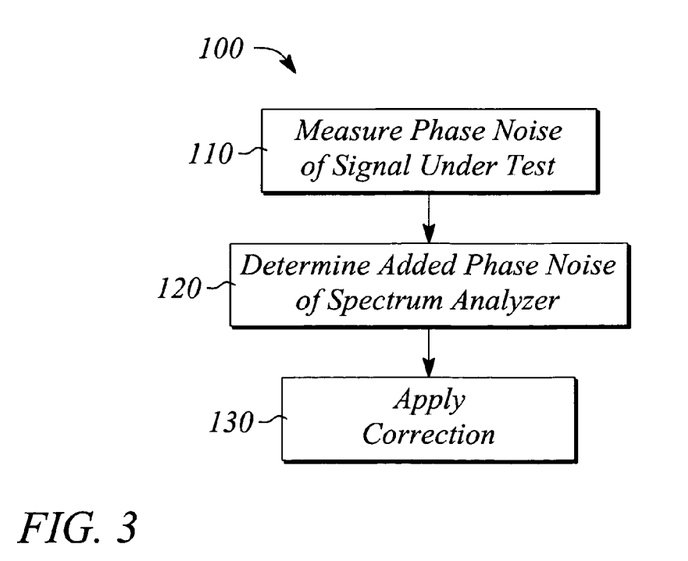
FIG. 3 illustrates a flow chart of the steps of the method of compensating for added phase noise of the present invention.

In one aspect of the invention, a method 100 of compensating for phase noise added by a spectrum analyzer to phase noise measurements of an SUT taken by the spectrum analyzer is provided. A flow chart of the steps of the method 100 of compensating for added phase noise is illustrated in FIG. 3. The method 100 of compensating for added phase noise comprises the step of measuring 110 phase noise $L(f_m)$ of the SUT. The step of measuring 110 is essentially the conventional method of measuring phase noise $L(f_m)$ with a spectrum analyzer. For example, the step of measuring 110 may comprise the step of applying 112 the SUT to an input of the spectrum analyzer, the step of sweeping 114 the frequency of the spectrum analyzer, the step of detecting and measuring 116 signal power at a plurality of offset frequencies $f_m$ and the step of computing 118 measured phase noise $L(f_m)$ at each of the offset frequencies $f_m$ (the conventional steps 112, 114, 116 and 118 are not illustrated herein). The result of the step of measuring 110 is a set of measured phase noise $L(f_m)$ values or measured phase noise $L(f_m)$ data.

The method 100 of compensating further comprises the step of determining 120 the added phase noise $L_{SA}(f_m)$ of the spectrum analyzer at each of the offset frequencies $f_m$ under reference conditions. The term 'reference condition', as used herein, refers to a measurement or an equivalent operation that mimics the conditions of the step of measuring 110, but does not involve the SUT. The step of determining 120 can be performed at some time prior to the step of measuring 110 and the results or data stored for later use, or the step of determining 120 can be performed each time the step of measuring 110 is performed. Thus, the step of determining 120 can preceded or follow the step of measuring 110.

Preferably, the step of determining 120 the added phase noise $L_{SA}(f_m)$ of the spectrum analyzer comprises a direct measurement of the added phase noise $L_{SA}(f_m)$ at the offset frequencies $f_m$ and under operational conditions of the spectrum analyzer that are similar or identical to those of the step of measuring 110 (i.e. reference conditions). Alternatively, the step of determining 120 can use added phase noise $L_{SA}(f_m)$ data measured and supplied by the manufacturer of the spectrum analyzer. Yet another alternative is to extract the added phase noise $L_{SA}(f_m)$ data from nominal added phase noise $L'_{SA}(f_m)$ specification data for the class of spectrum analyzers to which the spectrum analyzer belongs. Of course, the more accurate the added phase noise $L_{SA}(f_m)$ data is, the better will be the results of the method 100 of compensating for added phase noise.

In a preferred embodiment, the step of determining 120 comprises the step of generating 122 a clean or ultra-low phase noise reference signal at the carrier frequency $f_c$ of the SUT. The reference signal is a signal that has phase noise $L_{ref}(f_m)$ that is less than, and preferably much less than, the expected added phase noise $L_{SA}(f_m)$ being determined. The preferred embodiment of the step of determining 120 further comprises the step of measuring 124 the phase noise $L_{SA}(f_m)$ at each of the offset frequencies $f_m$. Typically, if the phase noise $L_{ref}(f_m)$ of the ultra-low phase noise signal is at least 10 dB below the added phase noise $L_{SA}(f_m)$ being determined 120, the effects of the phase noise $L_{ref}(f_m)$ of the ultra-low phase noise signal can be ignored and the step of measuring 124 essentially measures the added phase noise $L_{SA}(f_m)$ directly (the steps of generating 122 and measuring 124 of the preferred embodiment are not illustrated herein). Alternatively, the added phase noise $L_{SA}(f_m)$ can be computed using equation (3)

$$\mathcal{L}_{SA}(f_m) = 10\log\left(10^{\frac{\mathcal{L}_{ref}(f_m)}{10}} - 10^{\frac{\mathcal{L}'_{ref}(f_m)}{10}}\right) \qquad (3)$$

where $L'_{ref}(f_m)$ is an a priori known phase noise of the reference signal and $L_{ref}(f_m)$ is the measured phase noise of the reference signal using the spectrum analyzer in the step of determining 120. The reference signal phase noise $L'_{ref}(f_m)$ may be derived from data provided by a manufacturer of the reference source or the reference signal phase noise $L'_{ref}(f_m)$ may be measured using an independent phase noise measurement means. A specification for phase noise of the reference source may also be used to derive the reference signal phase noise $L'_{ref}(f_m)$ needed by equation (3). Of course, as one skilled in the art will recognize, the accuracy of the reference source phase noise $L'_{ref}(f_m)$ establishes the accuracy of the determined 120 added phase noise $L_{SA}(f_m)$.

The method 100 of compensating for added phase noise further comprises the step of applying 130 a mathematical correction to the measured phase noise data from the step of measuring 110. The correction that is applied 130 consists of calculating an actual phase noise value at each of the offset frequencies from the measured phase noise $L(f_m)$ data and the determined added phase noise $L_{SA}(f_m)$ data for the spectrum analyzer. The mathematical correction of the step of applying 130 is given by equation (4)

$$\mathcal{L}_A(f_m) = 10\log\left(10^{\frac{\mathcal{L}(f_m)}{10}} - 10^{\frac{\mathcal{L}_{SA}(f_m)}{10}}\right) \qquad (4)$$

where $L_A(f_m)$ represents the actual phase noise of the SUT after compensating for the added phase noise $L_{SA}(f_m)$ of the spectrum analyzer. Thus, the mathematical correction consists of subtracting from the measured phase noise $L(f_m)$ data the added phase noise $L_{SA}(f_m)$ data of the spectrum analyzer. As described hereinabove, if the added phase noise $L_{SA}(f_m)$ is not known precisely, an approximation of the added phase noise $L_{SA}(f_m)$ may be used instead. The accuracy of the approximation will, of course, directly affect the accuracy of the correction and, by extension, the accuracy of the actual phase noise $L_A(f_m)$ determined for the SUT in the step of applying 130.

By way of example, consider applying the method 100 to a SUT. Furthermore, assume that the measured phase noise $L(f_m)$ obtained in the step of measuring 110 at the offset frequency $f_m=10$ kHz is −116.5 dBc/Hz and the added phase noise $L_{SA}(f_m)$ obtained in the step of determining 120 at the offset frequency $f_m=10$ kHz is −117.0 dBc/Hz. The step of applying 130 a correction using equation (4) would yield an actual phase noise $L_{A(fm)}$ at the offset frequency $f_m=10$ kHz equal to −126.1 dBc/Hz for the SUT.

The preceding example demonstrates that the method 100 of compensating for added phase noise enables the determination of a more accurate actual phase noise $L_A(f_m)$ of the SUT than would be possible without the present invention. In the example hereinabove, the determined actual phase noise of the SUT is more than 9 dB below the added phase noise $L_{SA}(f_m)$ of the spectrum analyzer. Theoretically, the added phase noise $L_{SA}(f_m)$ contribution of the spectrum analyzer can be completely cancelled to produce an infinite actual phase noise $L_A(f_m)$ measurement range. In practice, measurement uncertainty and repeatability limit the amount of achievable compensation. With averaging of measurements, actual phase noise determinations up to approximately 10 dB below the added phase noise $L_{SA}(f_m)$ floor of the spectrum analyzer should be possible. If the reference signal has phase noise $L_{ref}(f_m)$ that is 20 dB lower than the added phase noise $L_{SA}(f_m)$ of the spectrum analyzer, for example, the spectrum analyzer can be effectively calibrated by the present invention to within an accuracy level of 0.05 dB. Furthermore, if the actual phase noise of the reference signal $L_{ref}(f_m)$ is known at all offset frequencies $f_m$, a version of equation (3) can be used to correct the determination 120 of added phase noise $L_{SA}(f_m)$.

The method 100 of compensating for added phase noise further comprises the optional step of displaying the corrected phase noise data. Thus, the compensation of method 100 can be accomplished in a manner that is essentially transparent to an individual performing the phase noise measurements. Moreover, as mentioned hereinabove, the order of the steps of measuring 110 and determining 120 can be reversed and still be within the scope of the present invention.

As described above, there are at least three possible, alternative embodiments of the step of determining 120. Also as noted above, the preferred and most accurate embodiment of the step of determining 120 is to measure the added phase noise under conditions that match those of the step of measuring 110 phase noise of the SUT as closely as possible (i.e. reference conditions). In particular, when using the ultra-low phase noise reference signal, it is preferred that the signal has a carrier frequency and a carrier power level that match as closely as possible those of the SUT. The other alternatives for the step of determining 120 mentioned hereinabove, especially using nominal added phase noise data, may be limited by errors introduced by variations in the added phase noise of a spectrum analyzer as a function of frequency and temperature, and aging. Even so, using the nominal phase noise data for the spectrum analyzer can compensate for some of the added phase noise $L_{SA}(f_m)$ and improve the determined accuracy of the actual phase noise $L_A(f_m)$ by several decibels. Using individually measured phase noise data for the spectrum analyzer supplied by the manufacturer can improve the compensation effectiveness even further than using the nominal data, especially when phase noise data across the frequency range are available.

For accurate phase noise results from the method 100 of the present invention, it may be helpful to average many individual measurements in the step of measuring 110. Likewise, averaging can be used to improve the accuracy of the step of determining 120. Averaging tends to remove random fluctuations in the measured data associated with detection and power measurement processing in the spectrum analyzer. Measurement averaging is a well-known technique in the art of spectrum analyzer measurements. In practice, a 10 dB of improvement in added phase noise compensation according to the present invention can be achieved by averaging the measurements 110, 120. Preferably, the measurements 110, 120 are averaged approximately 200 times. Thus, one using the method 100 of the present invention may trade off measurement speed for measurement accuracy and still be within the scope of the present invention. A more thorough discussion of measurement averaging with respect to spectrum analyzer measurements and noise can be found in Agilent Technologies Application Note 1303, *Spectrum Analyzer Measurements and Noise*, literature part number 5966-4008E, 1998, incorporated by reference herein.

Figure 4:
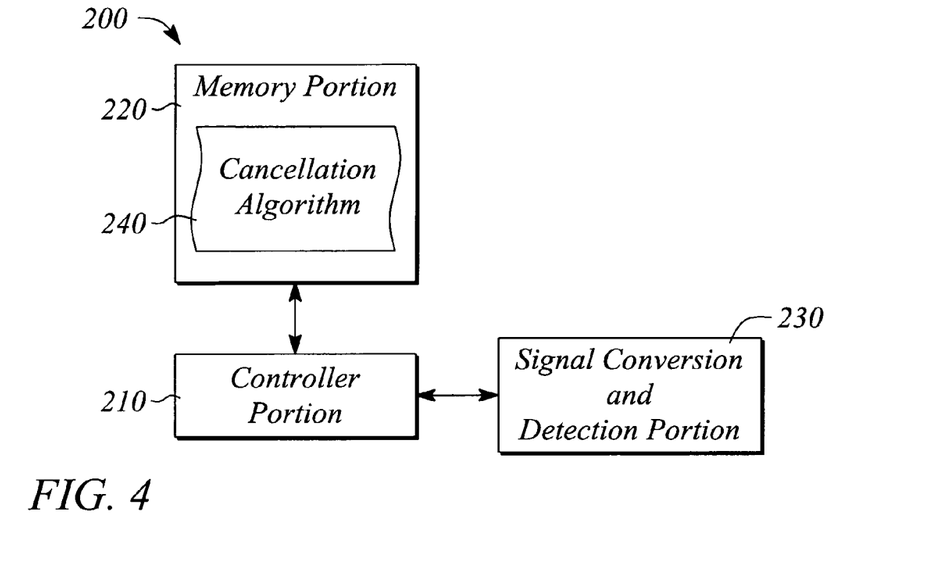
FIG. 4 illustrates a block diagram of a spectrum analyzer apparatus having added phase noise compensation of the present invention.

In another aspect of the invention, a spectrum analyzer apparatus 200 for determining an actual phase noise of a SUT is provided. The spectrum analyzer apparatus 200 compensates for the phase noise added by the spectrum analyzer to phase noise measurements of a SUT taken by the spectrum analyzer. The spectrum analyzer apparatus 200 is illustrated in FIG. 4. The spectrum analyzer apparatus 200 comprises a controller or processor portion 210, a memory portion 220, a signal conversion and detection portion 230, and a compensation algorithm 240 in the form of a computer program stored in the memory portion 220. One example of a signal conversion and detection portion 230 is illustrated in FIG. 1 as the elements 10, 20, 30, 40, 50, 60, 70 and 80. The processor portion 210 executes the compensation algorithm 240 during a phase noise measurement by the spectrum analyzer. The processor portion 210 can comprise a microprocessor or microcontroller, for example. Alternatively, the processor portion 210 can be implemented as an application specific integrated circuit (ASIC). One of ordinary skill in the art is familiar with processors useful for the invention.

In addition to storing the computer program, the memory portion 220 may provide temporary storage for data produced by the signal conversion and detection portion 230 as well as storage of added phase noise data. The memory portion 220 comprises computer memory that is read/write enabled. For example, the memory can be random access memory (RAM) or can be a form of magnetic media such as a disk drive or tape. RAM is preferred. One skilled in the art is familiar with memory suitable for the memory portion 220 of the present invention. The computer program may provide additional control and processing functions to the spectrum analyzer apparatus 200 in addition to the compensation algorithm 240.

The compensation algorithm 240, implemented in the form of a computer program, essentially performs the method 100 according to the present invention. In particular, the compensation algorithm 240 performs the step of applying 130 a correction using equation (4) to measured phase noise data produced by the signal conversion and detection portion 230 as part of a phase noise measurement. The compensation algorithm 240 may also automate the steps of measuring 110 phase noise of the SUT to generate the measured phase noise data and of determining 120 the added phase noise of the spectrum analyzer apparatus 200 to produce added phase noise data. Alternatively, the step of determining 120 can be performed once during a calibration process for the spectrum analyzer apparatus 200 and the results stored in the memory portion 220. In this latter case, the compensation algorithm 240 merely recalls the previously stored added phase noise data from the memory portion 220 during operation of the program and uses the stored data to apply 130 the correction. Depending on the nature of the memory portion 220, the computer program is stored either as software or as firmware. Given the discussion hereinabove, including equation (4), one skilled in the art could readily create just such a computer program without undue experimentation.

Figure 5:
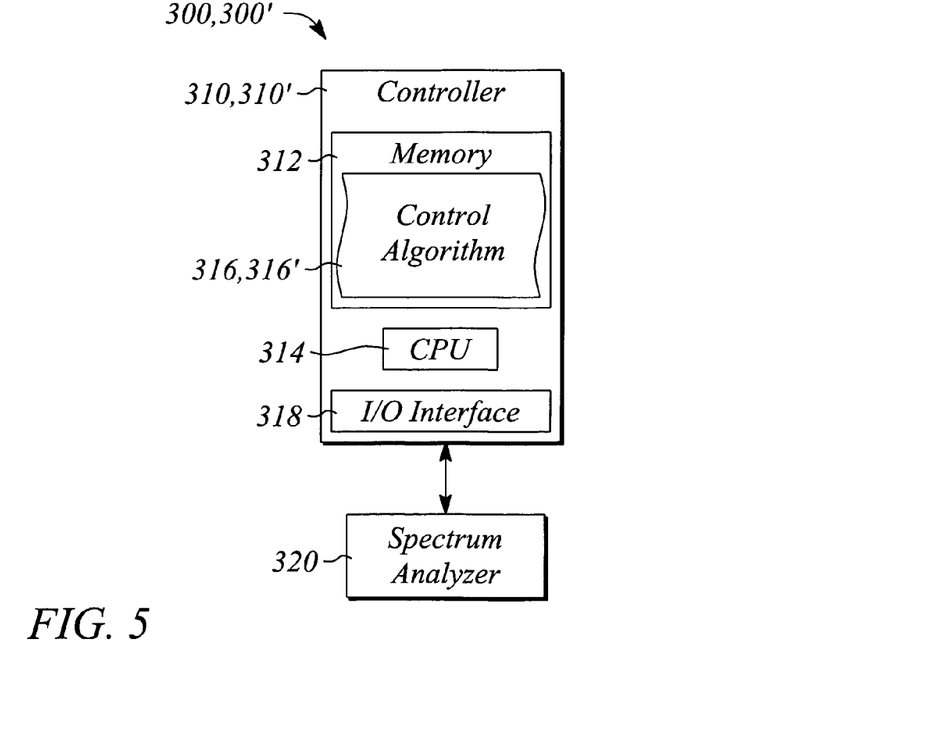
FIG. 5 illustrates a block diagram of a system according to the present invention that compensates for added phase noise by a spectrum analyzer in phase noise measurements of a signal under test (SUT) to yield a more accurate determination of an actual phase noise of the SUT.

In another aspect of the invention, a system 300 that compensates for phase noise added by a spectrum analyzer to phase noise measurements of a SUT taken by the spectrum analyzer is provided. A block diagram of the system 300 of compensating is illustrated in FIG. 5. The system 300 comprises a controller 310 and a spectrum analyzer 320. The spectrum analyzer 320 can be any spectrum analyzer known or that may be used in the art. In one embodiment, the controller 310 is a general-purpose computer, such as a personal computer (PC). The controller 310 comprises a memory 312, a central processing unit (CPU) 314, a control algorithm 316 stored in the memory 312, and an input/output control interface 318. The controller 310 controls the execution of the control algorithm 316 using the CPU 314 and controls the spectrum analyzer 320 using the control interface 318 during a phase noise measurement of the SUT. The control algorithm 316 is in the form of computer program stored as software or firmware and essentially implements the steps of the method 100. Given the discussion hereinabove, including equations (3) and (4), one skilled in the art could readily generate just such a computer program that incorporates the control algorithm 316 without undue experimentation.

The CPU 314 executes the control algorithm 316 under the control of the controller 310. In particular, the control algorithm 316 executed by the CPU 314 implements the step of measuring 110 the phase noise L(f$_m$) for the SUT by instructing the spectrum analyzer 320 to perform a measurement. The control algorithm 316 further implements the step of applying 130 a mathematical correction by using measured phase noise data in conjunction with stored added phase noise data. The stored added phase noise data is determined by the step of determining 120 and stored in the memory 312. The step of determining 120 may be implemented as part of the control algorithm 316 or may be performed by another means, in which case the control algorithm 316 simply utilizes the stored added phase noise data.

In another embodiment, the system 300' does not control the spectrum analyzer 320. Instead, in this alternate embodiment, the system 300' simply receives the SUT measured phase noise L(f$_m$) data from the spectrum analyzer 320 via the interface 318. The controller 310' then applies the correction using a portion of the control algorithm 316' that implements the step of applying 130 according to the method 100 of the present invention.

Thus, there have been described a method 100, an apparatus 200, and a system 300, 300' that compensate for added phase noise associated with a spectrum analyzer in measurements of phase noise of the SUT. It should be understood that the above-described embodiments are merely illustrative of the some of the many specific embodiments that represent the principles of the present invention. Clearly, those skilled in the art can readily devise numerous other arrangements without departing from the scope of the present invention as defined by the following claims.

What is claimed is:

1. A method of compensating for phase noise added by a spectrum analyzer to measurements of phase noise of a signal under test (SUT) taken by the spectrum analyzer, the method comprising the step of:
   applying a correction to a measured phase noise L(f$_m$) value for the SUT to determine an actual phase noise L$_A$(f$_m$) value for the SUT, wherein the correction comprises mathematically removing an added phase noise L$_{SA}$(f$_m$) value contributed by the spectrum analyzer from the measured phase noise L(f$_m$) value of the SUT.

2. The method of claim 1 wherein the mathematical correction and the actual phase noise L$_A$(f$_m$) value is given by $$\mathcal{L}_A(f_m) = 10\log\left(10^{\frac{\mathcal{L}(f_m)}{10}} - 10^{\frac{\mathcal{L}_{SA}(f_m)}{10}}\right)$$

wherein the term f$_m$ is an offset frequency.

3. The method of claim 1 further comprising the step of measuring phase noise L(f$_m$) values of the SUT at a plurality of offset frequencies f$_m$ prior to performing the step of applying the correction.

4. The method of claim 3 wherein the step of measuring comprises averaging a plurality of measurements of the phase noise L(f$_m$) values corresponding to each offset frequency f$_m$.

5. The method of claim 1 further comprising the step of displaying the corrected actual phase noise L$_A$(f$_m$) data.

6. The method of claim 1 further comprising the step of determining the added phase noise L$_{SA}$(f$_m$) value of the spectrum analyzer at a plurality of offset frequencies f$_m$.

7. The method of claim 6, wherein the step of determining comprises the step of extracting the added phase noise L$_{SA}$(f$_m$) value of the spectrum analyzer from data supplied by a manufacturer of the spectrum analyzer.

8. The method of claim 6, wherein the step of determining comprises the step of extracting the added phase noise L$_{SA}$(f$_m$) value of the spectrum analyzer from added phase noise L'$_{SA}$(f$_m$) specification data for a class of spectrum analyzers to which the spectrum analyzer belongs.

9. The method of claim 6, wherein the step of determining comprises the steps of:
   generating a reference signal having a phase noise L$_{ref}$(f$_m$);
   measuring a phase noise L$_{ref}$(f$_m$) value of the reference signal at each of the offset frequencies f$_m$ with the spectrum analyzer; and
   computing the added phase noise L$_{SA}$(f$_m$) value of the spectrum analyzer from the measured reference signal phase noise L$_{ref}$(f$_m$) value at each of the offset frequencies f$_m$.

10. The method of claim 9, wherein the measured reference signal phase noise L$_{ref}$(f$_m$) value is the added phase noise L$_{SA}$(f$_m$) value of the spectrum analyzer.

11. The method of claim 9, wherein the step of computing comprises subtracting a known reference signal phase noise L'$_{ref}$(f$_m$) value from the measured reference signal phase noise L$_{ref}$(f$_m$) value according to $$\mathcal{L}_{SA}(f_m) = 10\log\left(10^{\frac{\mathcal{L}_{ref}(f_m)}{10}} - 10^{\frac{\mathcal{L}'_{ref}(f_m)}{10}}\right)$$

to yield the added phase noise L$_{SA}$(f$_m$) value of the spectrum analyzer at an offset frequency f$_m$.

12. The method of claim 2 further comprising the steps of:
   measuring the phase noise L(f$_m$) value of the SUT at a plurality of offset frequencies f$_m$; and
   determining the added phase noise L$_{SA}$(f$_m$) value of the spectrum analyzer at each of the offset frequencies f$_m$,
   wherein the step of measuring and the step of determining are performed prior to performing the step of applying the correction.

13. The method of claim 12, wherein the step of determining comprises the steps of:
   generating a reference signal having a phase noise L$_{ref}$(f$_m$);
   measuring a phase noise L$_{ref}$(f$_m$) value of the reference signal at each of the offset frequencies f$_m$ with the spectrum analyzer, wherein the measured phase noise L$_{ref}$(f$_m$) value of the reference signal is the determined added phase noise L$_{SA}$(f$_m$) value of the spectrum analyzer.

14. The method of claim 12, wherein the step of determining comprises the step of extracting the added phase noise L$_{SA}$(f$_m$) value of the spectrum analyzer from data supplied by a manufacturer of the spectrum analyzer.

15. The method of claim 12, wherein the step of determining comprises the step of extracting the added phase noise L$_{SA}$(f$_m$) value of the spectrum analyzer from added phase noise L'$_{SA}$(f$_m$) specification data for a class of spectrum analyzers to which the spectrum analyzer belongs.

16. A method of determining an actual phase noise of a signal under test (SUT), the method comprising:
   measuring phase noise of a spectrum analyzer under reference conditions to obtain an added phase noise value;
   measuring phase noise of the SUT using the spectrum analyzer to obtain a measured phase-noise value; and calculating an actual phase noise according to $$\mathcal{L}_A(f_m) = 10\log\left(10^{\frac{\mathcal{L}(f_m)}{10}} - 10^{\frac{\mathcal{L}_{SA}(f_m)}{10}}\right)$$

wherein the term $L_A(f_m)$ is the actual phase noise value at an offset frequency $f_m$, and the terms $L(f_m)$ and $L_{SA}(f_m)$ are the measured phase noise value of the SUT and the added phase noise value of the spectrum analyzer at the offset frequency $f_m$, respectively.

17. The method of claim 16, wherein measuring phase noise of the spectrum analyzer under reference conditions comprises:
   generating a reference signal;
   measuring a phase noise $L_{ref}(f_m)$ value of the reference signal at each of the offset frequencies $f_m$ with the spectrum analyzer; and
   computing the added phase noise $L_{SA}(f_m)$ value of the spectrum analyzer from the measured reference signal phase noise $L_{ref}(f_m)$ value at each of the offset frequencies $f_m$.

18. The method of claim 17, wherein computing comprises subtracting a known reference signal phase noise $L'_{ref}(f_m)$ value from the measured reference signal phase noise $L_{ref}(f_m)$ value according to $$\mathcal{L}_{SA}(f_m) = 10\log\left(10^{\frac{\mathcal{L}_{ref}(f_m)}{10}} - 10^{\frac{\mathcal{L}'_{ref}(f_m)}{10}}\right)$$

to yield the added phase noise $L_{SA}(f_m)$ value of the spectrum analyzer at the offset frequency $f_m$.

19. A spectrum analyzer apparatus that corrects for added phase noise contributed by the spectrum analyzer in measurements of phase noise of a signal under test, the apparatus comprising:
   a signal conversion and detection portion that measures phase noise $L(f_m)$ data of the signal under test;
   a memory portion that provides data and information storage;
   a controller portion that controls the signal conversion and detection portion; and
   a compensation algorithm stored in the memory portion and executed by the controller portion, wherein the executed compensation algorithm applies a mathematical correction to the measured phase noise $L(f_m)$ data of the signal under test, the correction comprising a compensation for added phase noise $L_{SA}(f_m)$ data in the measured phase noise $L(f_m)$ data to produce actual phase noise $L_A(f_m)$ data for the signal under test.

20. The apparatus of claim 19 wherein the mathematical correction and the actual phase noise $L_A(f_m)$ data is given by $$\mathcal{L}_A(f_m) = 10\log\left(10^{\frac{\mathcal{L}(f_m)}{10}} - 10^{\frac{\mathcal{L}_{SA}(f_m)}{10}}\right)$$

where $f_m$ is an offset frequency.

21. The apparatus of claim 19, wherein the memory portion comprises the added phase noise $L_{SA}(f_m)$ data that is used by the compensation algorithm.

22. The apparatus of claim 21, wherein the added phase noise $L_{SA}(f_m)$ data is measured by the signal conversion and detection portion.

23. A system comprising:
   a spectrum analyzer that measures phase noise $L(f_m)$ data of a signal under test (SUT); and
   a controller that mathematically corrects the phase noise $L(f_m)$ data of the SUT measured by the spectrum analyzer to produce actual phase noise $L_{SA}(f_m)$ data for the SUT; wherein the system compensates for phase noise added by the spectrum analyzer.

24. The system of claim 23, wherein the controller comprises a control algorithm that mathematically removes added phase noise $L_{SA}(f_m)$ data contributed by the spectrum analyzer from the measured phase noise $L(f_m)$ data of the signal under test.

25. The system of claim 24, wherein the controller further comprises:
   a memory;
   a central processing unit (CPU), wherein the control algorithm is stored in the memory and executed by the CPU; and
   an input/output interface that interfaces with the spectrum analyzer,
   wherein the executed control algorithm receives the measured phase noise $L(f_m)$ data for the SUT from the spectrum analyzer using the interface, and wherein the control algorithm implements $$\mathcal{L}_A(f_m) = 10\log\left(10^{\frac{\mathcal{L}(f_m)}{10}} - 10^{\frac{\mathcal{L}_{SA}(f_m)}{10}}\right)$$

to compensate for the added phase noise $L_{SA}(f_m)$ data contributed by the spectrum analyzer from the measured phase noise $L(f_m)$ data of the signal under test to produce the actual phase noise $L_A(f_m)$ data for the signal under test, where $f_m$ is an offset frequency.

26. The system of claim 25, wherein the executed control algorithm further controls the spectrum analyzer using the interface during a phase noise measurement of the signal under test.

27. A spectrum analyzer comprising:
   a signal conversion and detection portion that measures phase noise $L(f_m)$ of a signal under test at an offset frequency $f_m$;
   a memory portion that provides data and information storage;
   a controller portion that controls the signal conversion and detection portion; and
   a compensation program stored in the memory portion and executed by the controller portion, the executed compensation program applying a mathematical correction to the measured phase noise $L(f_m)$ to produce an actual phase noise $L_A(f_m)$ for the signal under test, the correction comprising compensation for added phase noise $L_{SA}(f_m)$ associated with the spectrum analyzer in the measured phase noise $L(f_m)$, the added phase noise $L_{SA}(f_m)$ being either determined by measuring a reference signal phase noise $L_{ref}(f_m)$ value with the spectrum analyzer and removing from the reference signal phase noise $L_{ref}(f_m)$ an a priori known reference signal phase noise $L'_{ref}(f_m)$ value or determined from spectrum analyzer phase noise data supplied by a manufacturer of the spectrum analyzer.

28. The spectrum analyzer of claim 27, wherein the mathematical correction and the actual phase noise $L_A(f_m)$ data are given by $$\mathcal{L}_A(f_m) = 10\log\left(10^{\frac{\mathcal{L}(f_m)}{10}} - 10^{\frac{\mathcal{L}_{SA}(f_m)}{10}}\right)$$

and wherein removing comprises subtracting the known reference signal phase noise $L'_{ref}(f_m)$ value from the measured reference signal phase noise $L_{ref}(f_m)$ value according to $$\mathcal{L}_{SA}(f_m) = 10\log\left(10^{\frac{\mathcal{L}_{ref}(f_m)}{10}} - 10^{\frac{\mathcal{L}'_{ref}(f_m)}{10}}\right)$$

to yield the added phase noise $L_{SA}(f_m)$ of the spectrum analyzer.

29. The spectrum analyzer of claim 27, wherein the a priori known reference signal phase noise $L'_{ref}(f_m)$ is either derived from data provided by a manufacturer of the reference source or measured independently of measuring the reference signal phase noise $L_{ref}(f_m)$ value using the spectrum analyzer.

30. The spectrum analyzer of claim 27, wherein the added phase noise $L_{SA}(f_m)$ is determined from added phase noise $L'_{SA}(f_m)$ specification data for a class of spectrum analyzers to which the spectrum analyzer belongs.

* * * * *

UNITED STATES PATENT AND TRADEMARK OFFICE
CERTIFICATE OF CORRECTION

| | | |
|---|---|---|
| PATENT NO. | : 7,035,324 B2 | |
| APPLICATION NO. | : 09/922065 | |
| DATED | : April 25, 2006 | |
| INVENTOR(S) | : Mar et al. | |

It is certified that error appears in the above-identified patent and that said Letters Patent is hereby corrected as shown below:

On the face page, in field (56), under "Other Publications", in column 2, line 10, delete "vol." and insert -- Vol. --, therefor.

In column 11, line 37, in Claim 1, delete "L($f_m$)" and insert -- $\mathcal{L}(f_m)$ --, therefor.

In column 11, line 39, in Claim 1, delete "$L_A(f_m)$" and insert -- $\mathcal{L}_A(f_m)$ --, therefor.

In column 11, line 41, in Claim 1, delete "$L_{SA}(f_m)$" and insert -- $\mathcal{L}_{SA}(f_m)$ --, therefor.

In column 11, line 42, in Claim 1, delete "L($f_m$)" and insert -- $\mathcal{L}(f_m)$ --, therefor.

In column 11, line 44, in Claim 2, delete "$L_A(f_m)$" and insert -- $\mathcal{L}_A(f_m)$ --, therefor.

In column 11, line 51, in Claim 2, delete "$f_m$" and insert -- $f_m$ --, therefor.

In column 11, line 53, in Claim 3, delete "L($f_m$)" and insert -- $\mathcal{L}(f_m)$ --, therefor.

In column 11, line 54, in Claim 3, delete "$f_m$" and insert -- $f_m$ --, therefor.

In column 11, line 59, in Claim 4, delete "L($f_m$)" and insert -- $\mathcal{L}(f_m)$ --, therefor.

In column 11, line 60, in Claim 4, delete "$f_m$." and insert -- $f_m$ --, therefor.

In column 11, line 62, in Claim 5, delete "$L_A(f_m)$" and insert -- $\mathcal{L}_A(f_m)$ --, therefor.

In column 11, line 64, in Claim 6, delete "$L_{SA}(f_m)$" and insert -- $\mathcal{L}_{SA}(f_m)$ --, therefor.

In column 11, line 65, in Claim 6, delete "fm." and insert -- $f_m$. --, therefor.

In column 12, line 1, in Claim 7, delete "$L_{SA}(f_m)$" and insert -- $\mathcal{L}_{SA}(f_m)$ --, therefor.

In column 12, line 5, in Claim 8, delete "$L_{SA}(f_m)$" and insert -- $\mathcal{L}_{SA}(f_m)$ --, therefor.

In column 12, line 6, in Claim 8, delete "$L'_{SA}(f_m)$ and insert -- $\mathcal{L}_{SA}(f_m)$ --, therefor.

In column 12, lines 10-11, in Claim 9, delete "$L_{ref}(f_m)$;" and insert -- $\mathcal{L}_{ref}(f_m)$ --, therefor.

In column 12, line 12, in Claim 9, delete "$L_{ref}(f_m)$" and insert -- $\mathcal{L}_{ref}(f_m)$ --, therefor.

In column 12, line 13, in Claim 9, delete "$f_m$" and insert -- $f_m$ --, therefor.

UNITED STATES PATENT AND TRADEMARK OFFICE
CERTIFICATE OF CORRECTION

PATENT NO. : 7,035,324 B2
APPLICATION NO. : 09/922065
DATED : April 25, 2006
INVENTOR(S) : Mar et al.

It is certified that error appears in the above-identified patent and that said Letters Patent is hereby corrected as shown below:

In column 12, line 15, in Claim 9, delete "$L_{SA}(f_m)$" and insert -- $\mathcal{L}_{SA}(f_m)$ --, therefor.

In column 12, line 17, in Claim 9, delete "$L_{ref}(f_m)$" and insert -- $\mathcal{L}_{ref}(f_m)$ --, therefor.

In column 12, line 18, in Claim 9, delete "$f_m$-" and insert -- $f_m$. --, therefor.

In column 12, line 20, in Claim 10, delete "$L_{ref}(f_m)$" and insert -- $\mathcal{L}_{ref}(f_m)$ --, therefor.

In column 12, line 21, in Claim 10, delete "$L_{SA}(f_m)$" and insert -- $\mathcal{L}_{SA}(f_m)$ --, therefor.

In column 12, line 24, in Claim 11, delete "$L'_{ref}(f_m)$" and insert -- $\mathcal{L}'_{ref}(f_m)$ --, therefor.

In column 12, line 25, in Claim 11, delete "$L_{ref}(f_m)$" and insert -- $\mathcal{L}_{ref}(f_m)$ --, therefor.

In column 12, line 32, in Claim 11, delete "$L_{SA}(f_m)$" and insert -- $\mathcal{L}_{SA}(f_m)$ --, therefor.

In column 12, line 33, in Claim 11, delete "$f_m$-" and insert -- $f_m$. --, therefor.

In column 12, line 35, in Claim 12, delete "$L(f_m)$" and insert -- $\mathcal{L}(f_m)$ --, therefor.

In column 12, line 36, in Claim 12, delete "$f_m$;" and insert -- $f_m$; --, therefor.

In column 12, line 37, in Claim 12, delete "$L_{SA}(f_m)$" and insert -- $\mathcal{L}_{SA}(f_m)$ --, therefor.

In column 12, line 38, in Claim 12, delete "$f_m$," and insert -- $f_m$, --, therefor.

In column 12, lines 44-45, In Claim 13, delete "$L_{ref}(f_m)$;" and insert -- $\mathcal{L}_{ref}(f_m)$ ;--, therefor.

In column 12, line 46, in Claim 13, delete "$L_{ref}(f_m)$" and insert -- $\mathcal{L}_{ref}(f_m)$ --, therefor.

In column 12, line 47, in Claim 13, delete "$f_m$" and insert -- $f_m$ --, therefor.

In column 12, line 49, in Claim 13, delete "$L_{ref}(f_m)$" and insert -- $\mathcal{L}_{ref}(f_m)$ --, therefor.

In column 12, line 50, in Claim 13, delete "$L_{SA}(f_m)$" and insert -- $\mathcal{L}_{SA}(f_m)$ --, therefor.

In column 12, line 54, in Claim 14, delete "$L_{SA}(f_m)$" and insert -- $\mathcal{L}_{SA}(f_m)$ --, therefor.

UNITED STATES PATENT AND TRADEMARK OFFICE
CERTIFICATE OF CORRECTION

PATENT NO. : 7,035,324 B2
APPLICATION NO. : 09/922065
DATED : April 25, 2006
INVENTOR(S) : Mar et al.

It is certified that error appears in the above-identified patent and that said Letters Patent is hereby corrected as shown below:

In column 12, line 58, in Claim 15, delete "$L_{SA}(f_m)$" and insert -- $\mathcal{L}_{SA}(f_m)$ --, therefor.

In column 12, line 59, in Claim 15, delete "$L'_{SA}(f_m)$" and insert -- $\mathcal{L}'_{SA}(f_m)$ --, therefor.

In column 13, line 7, in Claim 16, delete "$L_A(f_m)$" and insert -- $\mathcal{L}_A(f_m)$ --, therefor.

In column 13, line 8, in Claim 16, delete "$f_m$," and insert -- $f_m$, --, therefor.

In column 13, line 8, in Claim 16, delete "$L(f_m)$" and insert -- $\mathcal{L}(f_m)$ --, therefor.

In column 13, line 9, in Claim 16, delete "$L_{SA}(f_m)$" and insert -- $\mathcal{L}_{SA}(f_m)$ --, therefor.

In column 13, line 11, in Claim 16, delete "$f_m$," and insert -- $f_m$, --, therefor.

In column 13, line 17, in Claim 17, delete "$L_{ref}(f_m)$" and insert -- $\mathcal{L}_{ref}(f_m)$ --, therefor.

In column 13, line 18, in Claim 17, delete "$f_m$" and insert -- $f_m$ --, therefor.

In column 13, line 19, in Claim 17, delete "$L_{SA}(f_m)$" and insert -- $\mathcal{L}_{SA}(f_m)$ --, therefor.

In column 13, line 21, in Claim 17, delete "$L_{ref}(f_m)$" and insert -- $\mathcal{L}_{ref}(f_m)$ --, therefor.

In column 13, line 22, in Claim 17, delete "$f_m$." and insert -- $f_m$. --, therefor.

In column 13, line 25, in Claim 18, delete "$L'_{ref}(f_m)$" and insert -- $\mathcal{L}'_{ref}(f_m)$ --, therefor.

In column 13, line 26, in Claim 18, delete "$L_{ref}(f_m)$" and insert -- $\mathcal{L}_{ref}(f_m)$ --, therefor.

In column 13, line 33, in Claim 18, delete "$L_{SA}(f_m)$" and insert -- $\mathcal{L}_{SA}(f_m)$ --, therefor.

In column 13, line 34, in Claim 18, delete "$f_m$." and insert -- $f_m$. --, therefor.

In column 13, line 40, in Claim 19, delete "$L(f_m)$" and insert -- $\mathcal{L}(f_m)$ --, therefor.

In column 13, line 48, in Claim 19, delete "$L(f_m)$" and insert -- $\mathcal{L}(f_m)$ --, therefor.

In column 13, line 50, in Claim 19, delete "$L_{SA}(f_m)$" and insert -- $\mathcal{L}_{SA}(f_m)$ --, therefor.

In column 13, line 51, in Claim 19, delete "$L(f_m)$" and insert -- $\mathcal{L}(f_m)$ --, therefor.

UNITED STATES PATENT AND TRADEMARK OFFICE
CERTIFICATE OF CORRECTION

PATENT NO. : 7,035,324 B2
APPLICATION NO. : 09/922065
DATED : April 25, 2006
INVENTOR(S) : Mar et al.

It is certified that error appears in the above-identified patent and that said Letters Patent is hereby corrected as shown below:

In column 13, line 52, in Claim 19, delete "$L_A(f_m)$" and insert -- $\mathcal{L}_A(f_m)$ --, therefor.

In column 13, line 54, in Claim 20, delete "$L_A(f_m)$" and insert -- $\mathcal{L}_A(f_m)$ --, therefor.

In column 13, line 61, in Claim 20, delete "$f_m$" and insert -- $f_m$ --, therefor.

In column 13, line 63, in Claim 21, delete "$L_{SA}(f_m)$" and insert -- $\mathcal{L}_{SA}(f_m)$ --, therefor.

In column 13, line 66, in Claim 22, delete "$L_{SA}(f_m)$" and insert -- $\mathcal{L}_{SA}(f_m)$ --, therefor.

In column 14, line 2, in Claim 23, delete "$L(f_m)$" and insert -- $\mathcal{L}(f_m)$ --, therefor.

In column 14, line 5, in Claim 23, delete "$L(f_m)$" and insert -- $\mathcal{L}(f_m)$ --, therefor.

In column 14, line 6, in Claim 23, delete "$L_{SA}(f_m)$" and insert -- $\mathcal{L}_{SA}(f_m)$ --, therefor.

In column 14, line 11, in Claim 24, delete "$L_{SA}(f_m)$" and insert -- $\mathcal{L}_{SA}(f_m)$ --, therefor.

In column 14, line 12, in Claim 24, delete "$L(f_m)$" and insert -- $\mathcal{L}(f_m)$ --, therefor.

In column 14, line 24, in Claim 25, delete "$L(f_m)$" and insert -- $\mathcal{L}(f_m)$ --, therefor.

In column 14, line 32, in Claim 25, delete "$L_{SA}(f_m)$" and insert -- $\mathcal{L}_{SA}(f_m)$ --, therefor.

In column 14, line 34, in Claim 25, delete "$L(f_m)$" and insert -- $\mathcal{L}(f_m)$ --, therefor.

In column 14, line 35, in Claim 25, delete "$L_A(f_m)$" and insert -- $\mathcal{L}_A(f_m)$ --, therefor.

In column 14, line 36, in Claim 25, delete "$f_m$" and insert -- $f_m$ --, therefor.

In column 14, line 43, in Claim 27, delete "$L(f_m)$" and insert -- $\mathcal{L}(f_m)$ --, therefor.

In column 14, line 44, in Claim 27, delete "$f_m;$" and insert -- $f_m;$ --, therefor.

In column 14, line 53, in Claim 27, delete "$L(f_m)$" and insert -- $\mathcal{L}(f_m)$ --, therefor.

In column 14, line 54, in Claim 27, delete "$L_A(f_m)$" and insert -- $\mathcal{L}_A(f_m)$ --, therefor.

In column 14, line 56, in Claim 27, delete "$L_{SA}(f_m)$" and insert -- $\mathcal{L}_{SA}(f_m)$ --, therefor.

UNITED STATES PATENT AND TRADEMARK OFFICE
CERTIFICATE OF CORRECTION

PATENT NO. : 7,035,324 B2
APPLICATION NO. : 09/922065
DATED : April 25, 2006
INVENTOR(S) : Mar et al.

It is certified that error appears in the above-identified patent and that said Letters Patent is hereby corrected as shown below:

In column 14, line 57, in Claim 27, delete "$L(f_m)$," and insert -- $\mathcal{L}(f_m)$ --, therefor.

In column 14, line 58, in Claim 27, delete "$L_{SA}(f_m)$" and insert -- $\mathcal{L}_{SA}(f_m)$ --, therefor.

In column 14, line 59, in Claim 27, delete "$L_{ref}(f_m)$" and insert -- $\mathcal{L}_{ref}(f_m)$ --, therefor.

In column 14, line 61, in Claim 27, delete "$L_{ref}(f_m)$" and insert -- $\mathcal{L}_A(f_m)$ --, therefor.

In column 14, line 62, in Claim 27, delete "$L'_{ref}(f_m)$" and insert -- $\mathcal{L}'_{ref}(f_m)$ --, therefor.

In column 14, line 66, in Claim 28, delete "$L_A(f_m)$" and insert -- $\mathcal{L}_A(f_m)$ --, therefor.

In column 15, line 7, in Claim 28, delete "$L'_{ref}(f_m)$" and insert -- $\mathcal{L}'_{ref}(f_m)$ --, therefor.

In column 15, line 8, in Claim 28, delete "$L_{ref}(f_m)$" and insert -- $\mathcal{L}_{ref}(f_m)$ --, therefor.

In column 16, line 1, in Claim 28, delete "$L_{SA}(f_m)$" and insert -- $\mathcal{L}_{SA}(f_m)$ --, therefor.

In column 16, line 4, in Claim 29, delete "$L'_{ref}(f_m)$" and insert -- $\mathcal{L}'_{ref}(f_m)$ --, therefor.

In column 16, line 8, in Claim 29, delete "$L_{ref}(f_m)$" and insert -- $\mathcal{L}_{ref}(f_m)$ --, therefor.

In column 16, line 11, in Claim 30, delete "$L_{SA}(f_m)$" and insert -- $\mathcal{L}_{SA}(f_m)$ --, therefor.

In column 16, line 12, in Claim 30, delete "$L'_{SA}(f_m)$" and insert -- $\mathcal{L}'_{SA}(f_m)$ --, therefor.

Signed and Sealed this

Seventeenth Day of April, 2007

JON W. DUDAS
*Director of the United States Patent and Trademark Office*